United States Patent [19]

Hirosawa

[11] Patent Number: 4,775,886
[45] Date of Patent: Oct. 4, 1988

[54] APPARATUS FOR PERFORMING A PLURALITY OF EDITING PROCESSES ACCORDING TO A PREDETERMINED ORDER OF PRIORITY WHILE RECORDING A COMPOSITE IMAGE

[75] Inventor: Makoto Hirosawa, Kyoto, Japan

[73] Assignee: Dainippon Screen Seizo Kabushiki Kaisha, Kyoto, Japan

[21] Appl. No.: 641,784

[22] Filed: Aug. 16, 1984

[30] Foreign Application Priority Data

Aug. 30, 1983 [JP] Japan .................... 58-157236

[51] Int. Cl.$^4$ .............. G03F 3/08; H04N 1/20; H04N 1/387; H04N 1/393

[52] U.S. Cl. .................... 358/77; 358/75; 358/256; 358/280; 358/283; 358/285; 358/287; 358/289; 358/296; 358/298

[58] Field of Search .......... 358/283, 75, 280, 298, 358/256, 285, 287, 289, 290, 291, 77, 78, 80, 296

[56] References Cited

U.S. PATENT DOCUMENTS

| | | | |
|---|---|---|---|
| 3,272,918 | 9/1966 | Koll et al. | 358/287 |
| 3,541,245 | 11/1970 | Wilby | 358/287 |
| 4,327,380 | 4/1982 | Yamada et al. | 358/287 |
| 4,338,636 | 7/1982 | Yamada et al. | 358/75 |
| 4,388,653 | 6/1983 | Yamada | 358/75 |
| 4,470,074 | 9/1984 | Yamada | 358/75 |
| 4,570,187 | 2/1986 | Ono et al. | 358/75 |
| 4,578,701 | 3/1986 | Nakaji | 358/75 |
| 4,591,904 | 5/1986 | Urabe et al. | 358/75 |
| 4,605,957 | 8/1986 | Yamada | 358/287 |
| 4,633,328 | 12/1986 | Saito et al. | 358/280 |
| 4,642,680 | 2/1987 | Yamada | 358/75 |
| 4,672,462 | 6/1987 | Yamada | 358/280 |
| 4,680,642 | 7/1987 | Shimano et al. | 358/75 |
| 4,684,979 | 8/1987 | Hirosawa | 358/75 |

FOREIGN PATENT DOCUMENTS

| | | | |
|---|---|---|---|
| 41-16972 | 9/1966 | Japan . | |
| 44-23651 | 10/1969 | Japan . | |
| 52-18601 | 5/1977 | Japan . | |
| 52-26413 | 7/1977 | Japan . | |
| 54-35613 | 3/1979 | Japan . | |
| 54-65601 | 5/1979 | Japan . | |
| 56-31273 | 3/1981 | Japan . | |
| 56-55948 | 5/1981 | Japan | 358/280 |
| 57-61372 | 4/1982 | Japan | 358/280 |

Primary Examiner—James J. Groody
Assistant Examiner—Randall S. Svihla
Attorney, Agent, or Firm—Poms, Smith, Lande & Rose

[57] ABSTRACT

An apparatus for editing picture images and reproducing edited images is disclosed. Positional information, which indicates areas of a film and color plate for which editing operations (including cropping, processing, bordering, flat tone processing, and cutting mask processing) are to be performed, is gathered in process for each color which is included in the color plate. Picture signals are obtained by photoelectrically scanning color original pictures, and the signals are stored and processed; a halftone dot area is created and the ratio data necessary for carrying out the above-described processing is selected and the color plate signals are organized so that the halftone dot area ratio is produced with pre-determined priority order according to the positional information. The editing apparatus thus performs sequentially the process of reproducing original images by recording and arranging the images according to a programmed operator selectable format. Editing operations are performed according to a pre-programmed priority sequence.

15 Claims, 7 Drawing Sheets

APPARATUS FOR PERFORMING A PLURALITY OF EDITING PROCESSES ACCORDING TO A PREDETERMINED ORDER OF PRIORITY WHILE RECORDING A COMPOSITE IMAGE

BACKGROUND OF THE INVENTION

The present invention relates to an editing apparatus for editing reproduced picture images which is adapted to perform collecting plates and editing operations such as cropping (trimming) processing, border processing, flat tone mask processing, cutting mask processing etc. by a relatively compact and simple circuit composition in which the afore-mentioned processing operations can be achieved in real time, when a plurality of original pictures are sequentially scanned for recording reproduced picture images corresponding to the original pictures.

In recent years color picture scanning recording machines such as a color scanner etc. have come into widespread use in plate-making operation of color original pictures. Recently functions of the above described color scanner have been further developed so that additional correcting operation and plate collecting operation which conventionally have been carried out in the retouching and the film-development stages may be performed by layout color scanner system (total color scanner system) which can process the above mentioned operation by its digital picture image processing functions controlled by a computer as already being practically used in some places.

The layout color scanner system, as mentioned the above, is a system in which all processing functions and operations which are needed in practice for color plate making, (i.e., color separation, color gradation correction, magnification conversion, masking, additional correction) can be electronically carried out.

In the layout color scanner system of the above-mentioned type, the data of the picture image (usual color gradation correction and magnification conversion have already been performed) obtained by sequentially scanning a plurality of original color pictures is first accumulated in a memory having large capacity such as a disc memory; then, it is secondly necessary that picture image data be stored in the read/write memory; thirdly, electronic processing of additional computer corrections to the collecting plates converts stored data into picture images for display on a CRT, wherein layout is completely finished; and then, fourthly, the data of the finished layout is stored in a separate memory unit, and the layout finished picture image converted data is read out of the separate memory to be recorded in a recording medium.

However, in the conventional layout color scanner of the above-mentioned type, picture image data of all original pictures must first be stored in a memory, so that there are disadvantages which included the need to increase the capacity of the memory so that memory becomes very large and the system itself becomes very complicated.

Further, in such conventional layout color scanner system, there are many cases in which additional correction and collecting plates are processed by applying additional software techniques. The techniques are excellent in degree of freedom, however, processing speed is not necessarily high. The control program of such a system therefore becomes very complicated, making operation of the system very troublesome.

SUMMARY OF THE INVENTION

The present invention solves the above-described disadvantages of the conventional methods and apparatus. Accordingly, it is an object of the present invention to provide an editing apparatus for editing picture images which can process collecting plate works, such as cropping or processing, by a relatively compact and simple circuit system.

It is another object to provide an editing apparatus for editing picture images in which coordinate values of a start point (scanning start point) and a stop point (scanning finish point) on the color original picture, color separating conditions such as densities of high points and shadow points, and coordinate values on a recording film (which are necessary for the collecting plates workings such as cropping processing) are previously set up and stored together with each number of the respective color original pictures. Thus, once the system has begun to scan color original pictures photoelectrically, reproduced picture images corresponding to each of the color picture images is developed sequentially in real time and recorded at the predetermined positions on the reproduced film with a predetermined reproduction magnification.

It is also further object of the present invention to provide an editing apparatus for recording simultaneously a plurality of color plates and picture images which have been subjected to collecting plates operation, for example, as having been disclosed in the Japanese Patent Publication (Kokoku) No. 52-18601.

Hereinafter, with reference to the accompanying drawings, preferred embodiments of the present invention will be described.

Hereinafter the present invention will describe a preferred embodiment of the present invention with reference to the accompanying drawings.

DETAILED DESCRIPTION OF THE PREFERRED EMBODIMENT

Figure 1:
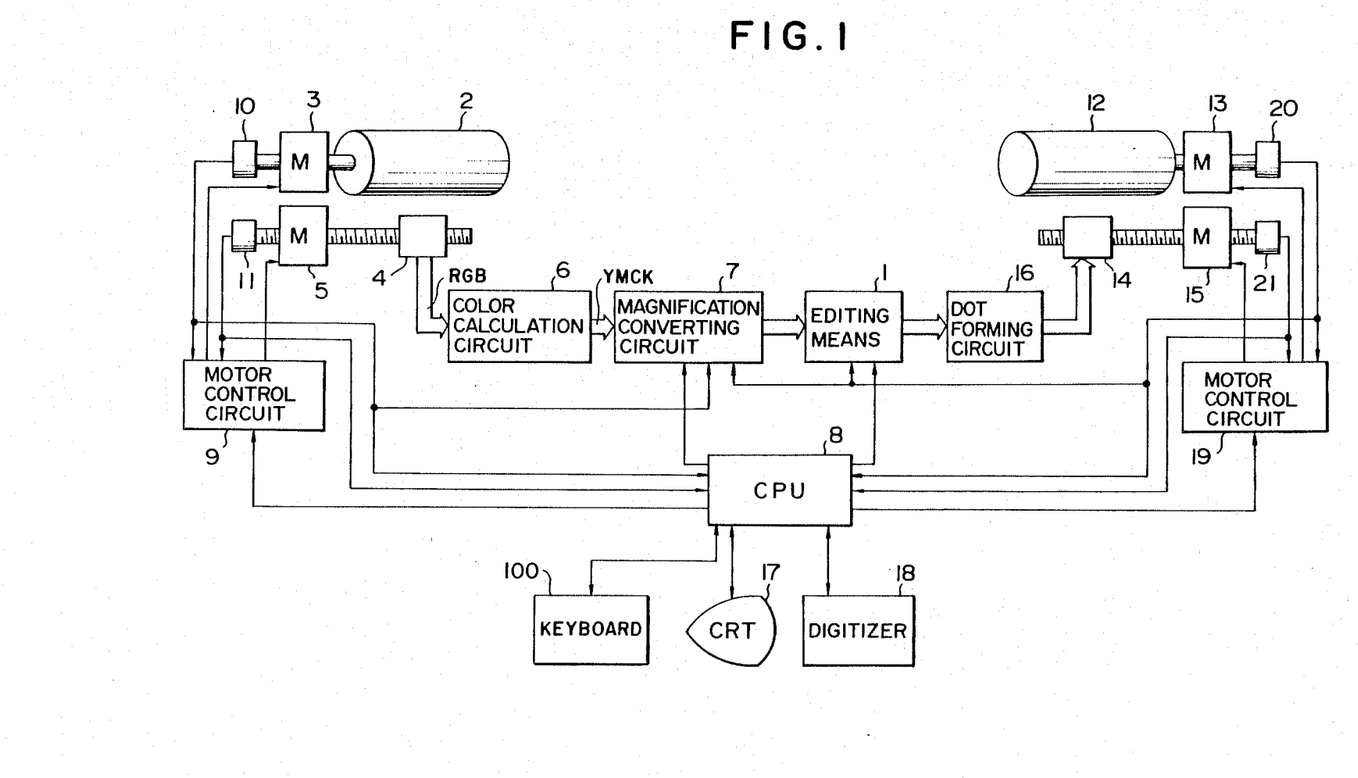
FIG. 1 is a block diagram showing an outline of construction of a color scanner applied to the present invention.

FIG. 1 is a block diagram showing a color scanner system having a picture reproduction and editing means 1 according to the present invention.

In FIG. 1 an original picture cylinder 2 is rotated by a main shaft motor 3 which drives a main shaft. A scanning head 4, which scans original pictures affixed to the original picture cylinder 2, photoelectrically picks up picture signals from those pictures. The cylinder 2 is driven by a sub-shaft motor 5 which drives a sub-shaft, and moves on a feeding screw in the sub-scanning direction with the feeding speed associated with reproduction magnification.

The rotational speed of the main shaft motor 3 and the sub shaft motor, through sensing by rotary encoder 10, are controlled respectively by a motor control circuit 9 according to command from a central processing unit 8 (hereinafter referred to as CPU 8). Rotational angle and number of revolutions of the original picture cylinder 2 are controlled by an N rotation per cycle (N/cycle pulse: clock pulse) and a one rotation per cycle pulse.

The rotary encoder 11 is connected to a rotational shaft of the sub-shaft motor 5, (like the main shaft motor 3) both the one rotation per cycle pulse and the N rotation per cycle pulse are input to the motor control circuit 9. The motor control circuit 9 is constructed so that the position of the scanning head 4 in the sub-scanning direction may be controlled according to instructions from the CPU 8.

Each of picture signals R (red), G (green) and B (blue) output from the scanning head 4 is output to a color calculation circuit 6 and as in conventional color scanners, after corrections have been made such as color correction, gradation correction, sharpness emphasis etc., they are output as four color plate signals of C (cyan), Y (yellow), K (black) and M (magenta).

The four color plate signals of C, M, Y and K output from the color calculation circuit 6 are input to a magnification converting circuit 7, and based upon instruction from the CPU 8, these four color plate signals are converted to picture signals (color plate signals) corresponding to these predetermined reproduction magnification and input to the editing apparatus.

Figure 2:
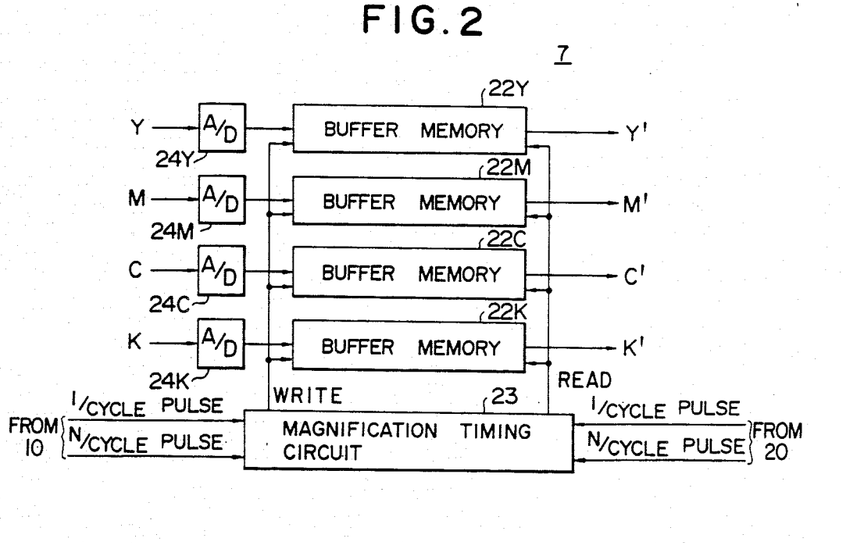
FIG. 2 is a block diagram showing an example of a magnification converting circuit.

In FIG. 2 there is shown an example of the magnification converting circuit 7 of FIG. 1, which is comprised of buffer memories $22_Y$, $22_M$, $22_C$ and $22_K$ which store each of, picture signals, Y, M, C and K, respectively, a magnification timing circuit 23, and analog-digital (A/D) converters $24_Y$, $24_M$, $24_C$ and $24_K$.

The picture signal Y is written into a "write" address and synchronized with a "write" pulse from the magnification timing circuit 23; the signal is then written into the Y buffer $22_Y$, then is synchronized with the "read" out pulse from the magnification timing circuit 23. Picture signal Y' having been stored in the read address, is then read out.

Other picture signals M, C, and K same as the above-mentioned picture signal Y', are also written into each of buffer memories $22_M$, $22_C$, and $22_K$ from the A/D converters $24_M$, $24_C$, and $24_K$, respectively. They are read out as M', C', and K', according to each of the timing signals corresponding to respective reproduction magnification. In this case, data for each one rotation of the original picture cylinder picture 2 is stored.

Frequencies of this "read out" pulse and the "write" pulse are adjusted in the magnification timing circuit 23, and results in reproduced picture image(s) which can be recorded with desired reproduction magnification in the main scanning direction. By setting up a "read out" address, appropriately under the control of the CPU 8, the picture signals Y', M', C', and K' may be also output by selecting record starting position(s) on a recording cylinder 12 in the main scanning direction as desired.

In addition, magnification converting circuits of this type, for example, there are some such as disclosed in the Japanese Patent Publication (Kokoku) No. 52-26413, and 54-65601; and, the Japanese Patent Publications (Kokoku) No. 41-16972 and No. 44-23651 (all of them are filed by or assigned to this Applicant, Dainippon Screen Seizo Kabushiki Kaisha) can be applied, but since the magnification converting circuit itself is not the gist of the present invention, description therefor is abbreviated in this specification.

The same control operation as that of the scanning side is carried out at the recording side. That is, the recording cylinder 12 is rotated with a main shaft motor 13, and a recording head 14, which records the reproduced picture images to the film attached on the recording cylinder 12, is controlled to move on a feeding screw which is driven by the sub-shaft motor (M) 5 toward the sub-scanning (arial direction of recording cylinder 12) direction.

Picture signals coming from the editing apparatus 1 (for which descriptions will follow) are fed through a halftone dot shaping circuits 16 per each of color plates, respectively, to the recording head 14.

Each of speeds of revolution of the main shaft motor 13 and the sub-shaft motor 15 at the recording side, is controlled, as same as those of the scanning side, respectively, by a motor control circuit 19; and, the rotational angle and the number of revolution of the recording cylinder 12 are controlled by N rotation per cycle pulse of a rotary encoder 20 connected to the rotational axis of the main shaft motor 13 and one rotation per cycle pulse.

Further, from a rotary encoder 21 connected to the rotational axis of the sub-shaft motor 15, like the main shaft motor 13, one rotation per cycle pulse and N rotation per cycle pulse are input in the motor control circuit 19. The motor control circuit 19 is constructed so that position of the recording head 14 in the sub-scanning direction may be controlled by instruction from the CPU 8.

The motor control circuits 9 and 19 of the scanning side and the recording side are constructed so that they may control each of the motors 3, 5, 13 and 15 according to instruction from the CPU 8.

Also, rotational frequencies, that is, the number of revolution, rotational angles of these cylinders 2 and 12, and positional signals of each of the heads 4 and 14 in the sub-scanning direction etc. are input to the CPU 8, and by applying one rotational per cycle pulse to the magnification converting circuit 7 and the editing apparatus 1, as described hereinafter, the scanning head 4 and the recording head 14 are moved to all desired positions to control editing operation of the reproduced picture images.

Further, as a method for coinciding cropping points (start point and stop point) on the original picture at this time and those points on the recording film, (for example, the method disclosed in the Japanese Patent Laid-Open Publication, (Kokai) No. 56-31273 (corresponding to Japanese Patent Application No. 54-107884 filed by the same Applicant, Dainippon Screen Seizo Kabushiki Kaisha) may be applied.

Detailed explanation regarding the editing apparatus 1 according to the present invention will be developed hereinafter. Firstly, with respect to each kind of picture, editing processings shown in FIGS. 3 and 4 detailed description, is given hereunder.

In picture signal processing functions of the editing apparatus 1, there are four kinds of functions, such as (a) cropping (trimming), (b) bordering, (c) flat tone masking and (d) cutting mask (knock out mask).

The technical term "cropping (trimming)" processing, in this specification, means a processing in which unnecessary picture signals per one rotation of the original picture cylinder 2, (that is, unnecessary picture signals among the picture signals corresponding to scanning line bodies, with the exception of areas necessary for specific picture patterns of the original picture) are masked to inhibit the picture signals at the masked areas.

Figure 3:
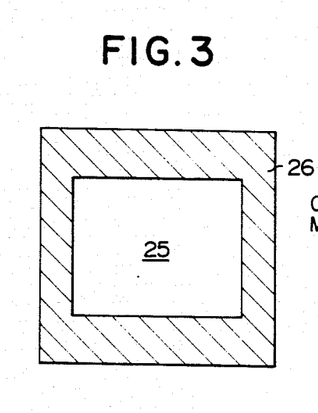
FIG. 3 and FIG. 4 are views showing examples of configurations of reproduced picture images recorded on recording films.

The bordering (border processing) is, as shown in FIG. 3, a processing for forming an area (flat tone) 26 in which halftone dots of a constant dot area ratio border around picture pattern area 25.

Figure 4:
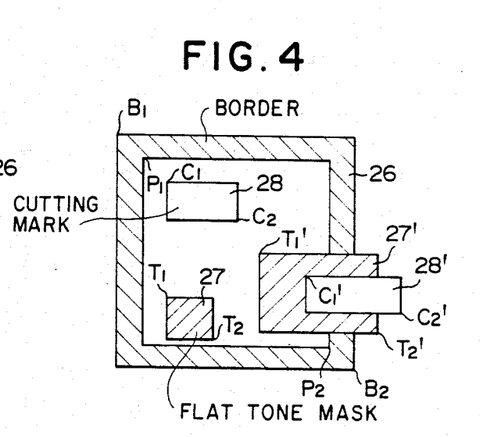

The flat tone masking processing means a technical processing for forming an area (which is formed in the inside and outside of the picture pattern area or extending over the picture pattern and the border thereof) in which halftone dots of a constant halftone dot area ratio are recorded. The formed areas are such as those shadowed portions 27, 27' as shown in FIG. 4.

The cutting mask processing is a processing for forming a picture by inhibiting a picture area; in other words, it is an area where the halftone dot has a halftone dot area ratio of 0%, and is adapted to record specific areas 28 and 28' such as picture pattern, border, flat tone etc.

Accordingly, in the present invention to realize these four kinds of processing functions, the following priority order is set up.

"Border" < "Cropping (trimming)" < "Flat tone masking" < "Cutting mask".

Figure 5:
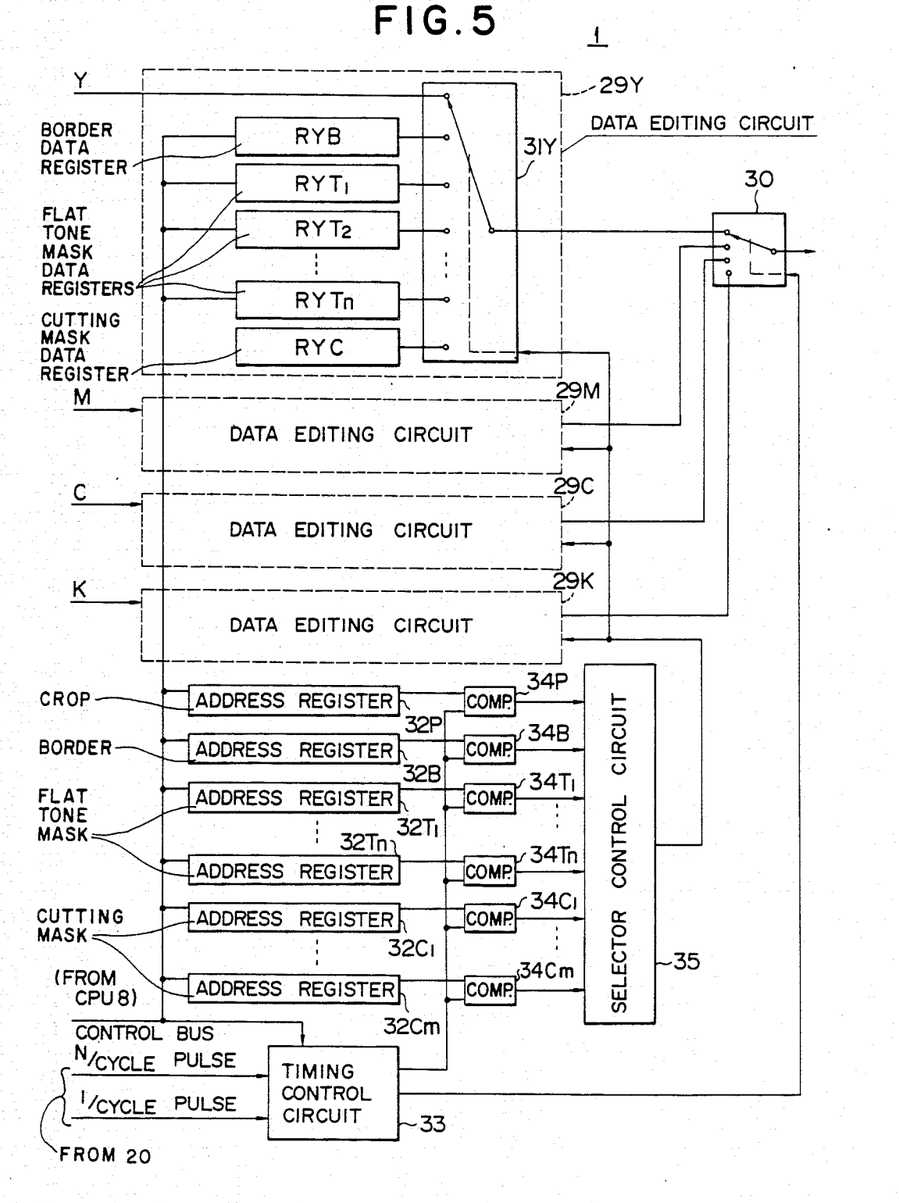
FIG. 5 is a block diagram showing one embodiment of the editing apparatus according to the present invention.

FIG. 5 is a block diagram showing one embodiment of an editing apparatus 1 of FIG. 1 according to the present invention. The editing apparatus comprises data editing circuits $29_Y$, $29_M$, $29_C$ and $29_K$, for each of color plates, a channel selector 30 and a control signal processing part.

For example, regarding color plate signal Y, data of the Y signal halftone dot area ratio for the border is stored in a data register $R_{YB}$ is the Y data editing circuit $29_Y$; data of Y signal halftone dot area ratio for forming flat tone masking for n portions is kept by data registers $R_{YT1}, R_{YT1}, \ldots R_{YTn}$; and, data register $R_{YC}$ stores data of halftone dot area ratio zero (0%) for forming a cutting mask. A selector switch $31_Y$ transfers data coming from color plate signal Y or specific register, and is selected by a predetermined timing.

Data is supplied to each of the above-described registers $R_{YB}$, $R_{YT1}$, $R_{YT2} \ldots R_{YTn}$ from the CPU which is programmable through a keyboard input means 100, and which is shown in FIG. 1; such input is accomplished, prior to photoelectrically scanning each of the color original pictures; the data is communicated through bus line, and addresses supplied simultaneously are stored in address registers $32_p$, $32_B$, $32_{T1} \ldots 32_{Tn}$, $32_{C1}, \ldots 32_{Cm}$.

Further, the reference number 33 in FIG. 5 designates a timing control circuit, and to this timing control circuit 33, an N rotation per cycle pulse and a one rotation per cycle pulse from the rotary encoder 20 (which is connected to the recording cylinder 12) are supplied, and the timing control circuit 33 is also connected to the CPU 8 through the control bus.

An address signal in the sub-scanning direction X and an address signal in the main scanning direction on the recording film are output to comparators $34_P$, $34_B$, $34_{T1} \ldots 34_{Tn}$, $34_{C1}, \ldots 34_{Cm}$, and direct the driving of the recording cylinder 12. Y, M, C and K selection signals are also supplied to the comparators as control signals for the channel selector 30 for performing tone and picture control.

With respect to a selector control switch 35 which supplies the control signals to a selector switch $31_Y$ etc., detailed explanation will be given with reference to FIG. 7. In the editing circuit (of FIG. 1) constructed as described the above, when reproduced pictures for a specific original picture are to be recorded, in order to record the reproduced pictures after having been carried out the cropping processing onto the specific original picture, the first addresses necessary for cropping the picture patterns must be recorded as start addresses and stop addresses in an address register $32_p$ in both X and Y directions.

Figure 6:
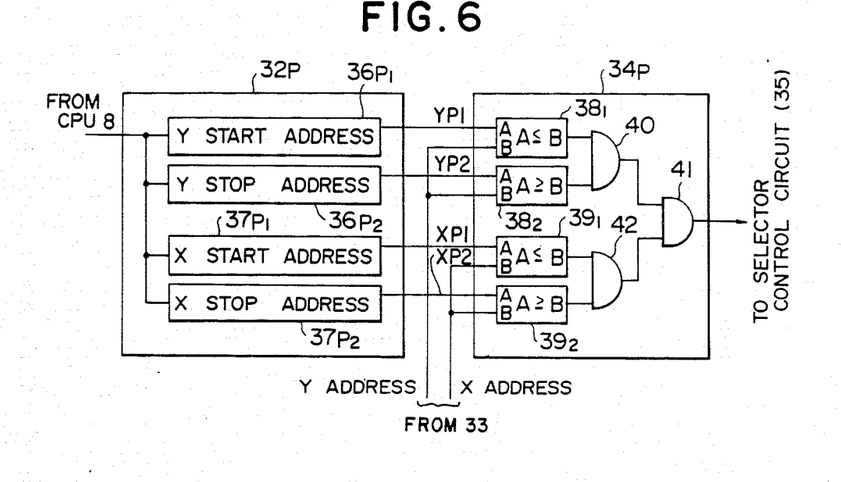
FIG. 6 is a block diagram showing an example of a circuit construction which designates areas to be processed.

In FIG. 6 there are shown examples of concrete construction of the address register $32_p$ which records the start and the stop addresses for cropping processing and the comparison circuit $34_p$.

The address register $32_p$ comprises a register $36_{P1}$ which stores the start address $Y_{P1}$ in the Y direction, a register $36_{P2}$ which stores the stop address $Y_{P2}$ in the Y direction, a register $37_{P1}$ which stores the start address $X_{p1}$ in the X direction and a register $37_{P2}$ which stores the stop address $X_{P2}$ in the X direction. Each address value of the above addresses is routed by the CPU 8 through the control bus, and each address is compared with each of address signals, in both X and Y directions, at the recording side from each of comparators $38_1$, $38_2$, $39_1$, and $39_2$ of the comparison circuit $34_P$.

The comparator $38_1$ outputs high level signal "1", when an input A is smaller than or equal to an input B, i.e., if there is a relation $A \leq B$, and the comparator $38_2$, is adapted to output high level signal "1", when there is a relation $A \geq B$ between A and B outputs. Thus, at an AND gate 40 logical product of the two comparators $38_1$ and $38_2$ is made.

Accordingly, the AND gate 40 Y address signal is formed at the recording side which is input to the comparison circuit 34P and is input to the above mentioned comparators $38_1$ and $38_2$, and if the Y address signal exists in a range between the start address $Y_{p1}$ and the stop address $Y_{p2}$ level signal "1" is output. Likewise, AND gate 42 combines signals compared at comparators $39_1$ and $39_2$, and gate 41 combines the signals from gates 40 and 42.

With respect to comparators $39_1$ and $39_2$ the same descriptions can be applied, that is, when the X address signal is in a range between the start address $X_{p1}$ and the stop address $X_{P2}$, the high level signal "1" is output.

Thus, from the AND gate 40, while the recording head 4 is scanning areas on the film (which corresponds to those of the recording film onto which the cropping processing should be performed), the high level signal "1" is output and fed to the selector control circuit 35 as a cropping code P of the comparator 34P.

As same as the above mentioned, with respect to the border processing the address register $32_B$, and the comparison circuit $34_B$ are provided, and with regard to the flat tone masking, for the purpose of controlling the flat tone masking at n positions, each of which is mutually independent, address registers $32_{T1}, \ldots 32_{Tn}$, and the comparison circuits $34_{T1} \ldots 34_{Tn}$ are mounted, and further the address registers $32_{C1} \ldots 32_{Cn}$, and the comparison circuits $34_{C1} \ldots 34_{Cn}$ are provided for controlling the cutting mask processing at n positions each of which is mutually independent. Each of the processed results is fed to the selector control circuit 35 timely as each of code signals P, B, $T_1 \ldots T_n$, $C_1 \ldots C_m$ respectively (see FIG. 7).

When the above described processings, such as flat tone masking, bordering and cutting mask processings are not carried out, it is also preferable that a value larger than the maximum value of address signals of the X and the Y direction is set up and stored in the corresponding address register as a start address, or the start address to be set up and stored in the corresponding address register is determined to a larger value than that of the stop address.

Figure 7:
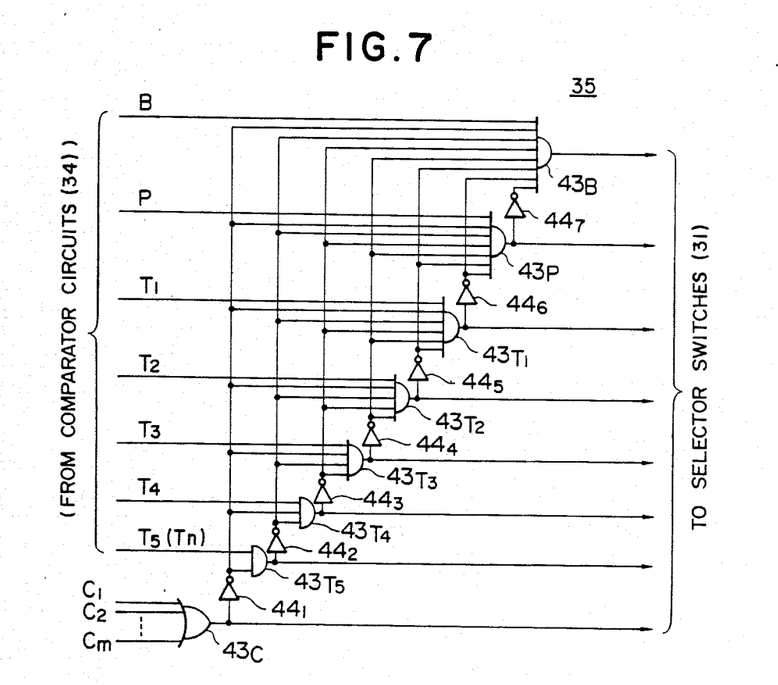
FIG. 7 is a block diagram showing an example of a circuit construction for determining the order of priority of each process operation.

In FIG. 7 there is shown an example of construction of the selector control circuit 35 (of FIG. 5) at the case of the largest number of the flat tone processing being 5 (=n).

In this selector control circuit 35 as the afore-mentioned priority order of processing functions are determined, and in this case as afore-mentioned, the priority order among those processings functions is as follows:

"Bordering"<"Cropping(Trimming)"<"Flat Tone Masking"<"Cutting mask".

As shown in FIG. 7, to an OR gate $43_C$ cutting mask codes $C_1 \ldots C_m$ from the comparator circuits $34_{C1} \ldots 34_{Cm}$ are supplied. While to AN gates $43_{T1} \ldots 43_{T5}$ flat tone codes $T_1 \ldots T_5$, are input, the cropping code P is fed to an AND gate $43_p$, and to an AND gate $43_B$ a bordering code B is input.

An output signal from the OR gate $43_C$ is input to these AND gates $43_{T1} \ldots 43_{T5}$, $43_P$ and $43_B$ through an inverter $44_1$. Therefore, the cutting mask codes $C_1 \ldots C_m$ are fed, by taking the priority order of the cropping code P and the bordering code B, to each of the data editing circuits $29_Y$, $29_M$, $29_C$ and $29_K$, from the OR gate $43_C$.

Figure 8:
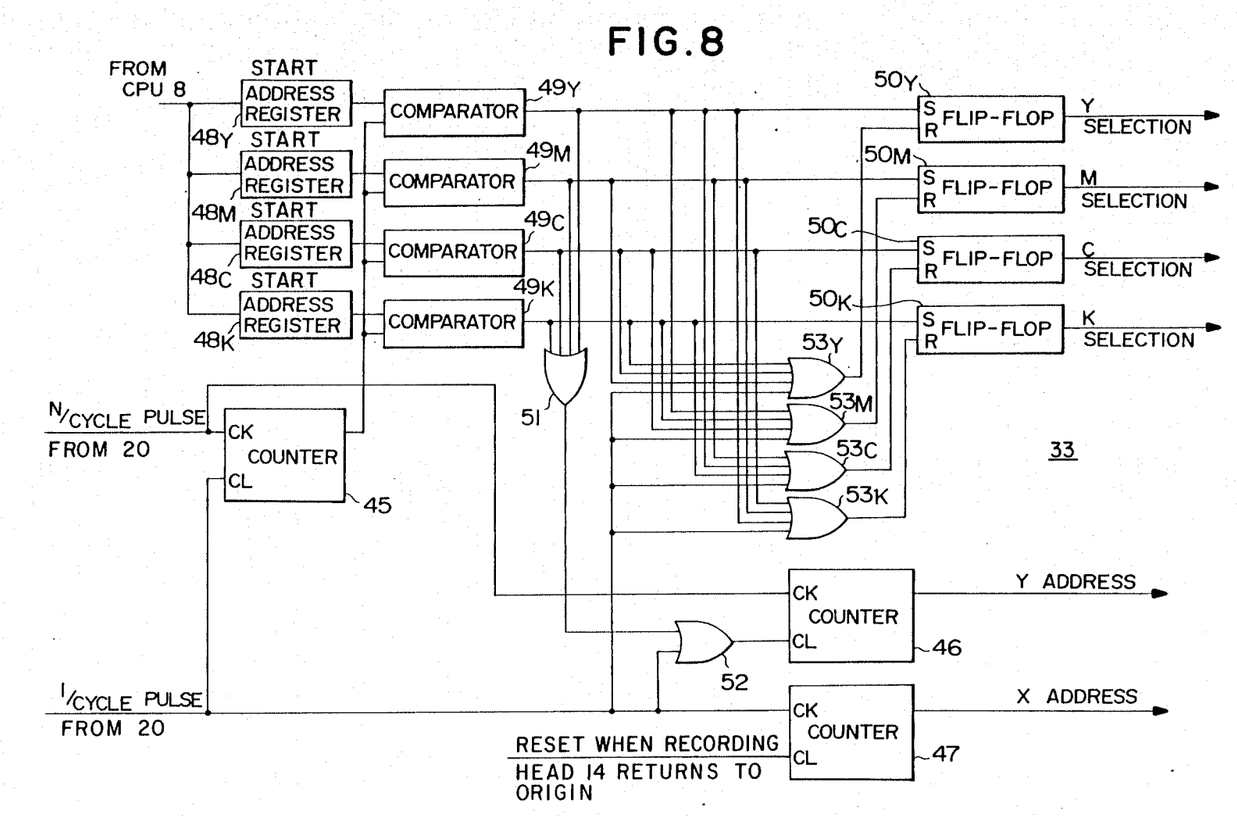
FIG. 8 is a block diagram of an example of a timing control circuit.
Figure 9:
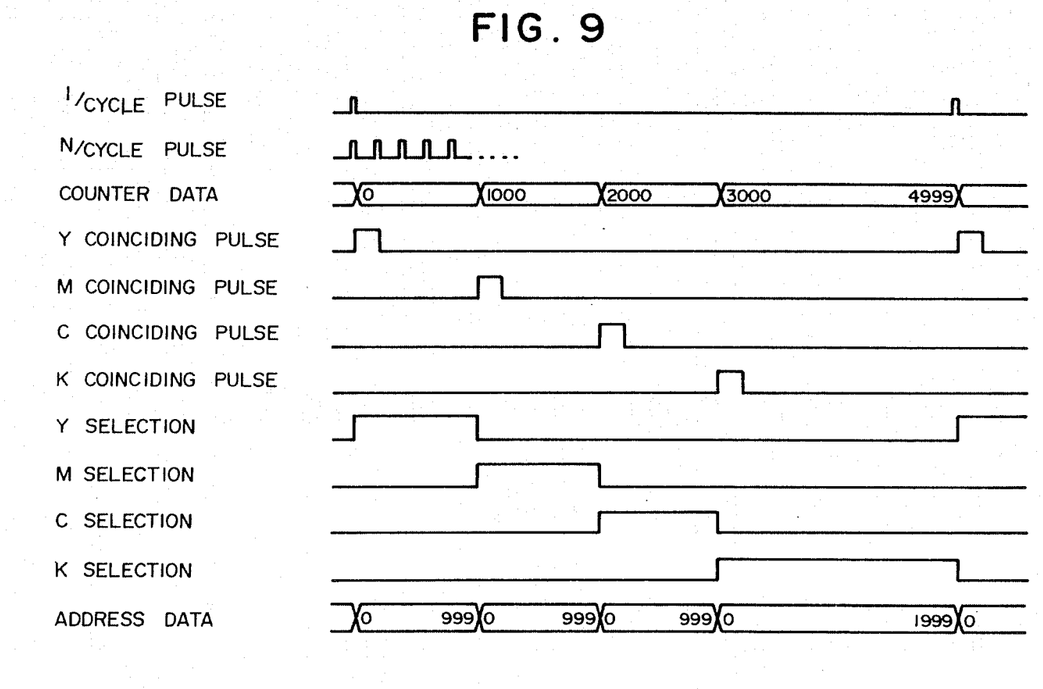
FIG. 9 is a timing chart showing an example of operational procedures by the same timing control circuit.

To the AND gate $43_{T4}$ each of output signals from the inverter $44_1$ and $44_2$ is input, to the AND gate $43_{T3}$ each of the output signals from the inverters $44_1 \ldots 44_3$ is input, to the AND gate $43_{T2}$ each of the output signals from the inverters $44_1 \ldots 44_4$ is supplied, to the AND gate $43_{T1}$ each of the output signals from the inverters $44_1$ and $44_5$ is output, to the AND gate $43_p$ each of the output signals from the inverters $44_1 \ldots 44_6$ is fed, and each of the output signals of the inverters $44_1 \ldots 44_7$ is output of an AND gate $43_B$, respectively. Thereby, the selector control circuit 35 controls, each of the above described processings being performed such as mentioned the above priority order, the selector switch 31 in each of the editing circuits $29_Y$, $29_M$, $29_C$ and $29_K$. In FIG. 8 and FIG. 9 there are shown examples of timing control methods in the editing apparatus according to the present invention, and in FIG. 8 there is shown the timing control circuit 33 of FIG. 5, and FIG. 9 is a timing chart thereof.

The output signal of the timing circuit 33 (FIG. 5) is generated by the circuit comprising: a counter 45 (FIG. 8) which is cleared away by one rotation per cycle from the rotary encoder 20 (mounted onto the rotating shaft of the recording cylinder 12) and the encoder 20 signals counter 45 to count N rotations per cycle pulse; a Y address counter 46 (in the main scanning direction) and an X address counter 47 (in the subscanning direction); as well as the start address registers $48_Y$, $48_M$, $48_C$, and $48_K$ (in which each of the start addresses on the respective color plates of Y, M, C and K on the recording similar 12 is set up and stored according to control data of the CPU); comparison circuits $49_Y$, $49_M$, $49_C$, and $49_K$ (which compare addresses set up in each of the start addresses compare addresses set up in each of the registers $48_Y$, $48_M$, $48_C$, and $48_K$, with the number of and rotations per cycle pulse input from the counter 45); flip-flip (F/F) circuits $50_Y$, $50_M$, $50_C$, and $50_K$ (which are set by coincidence signal from these comparisons circuits 48Y, 49M, 49C, and 49K and reset by one rotation per cycle pulse or coincidence signal(s) from other comparison circuits); and, 2 OR gates 51 and 52 performing a clear pulse of the Y address counter 46.

These counter 45 and 46 are configured so that, for example, if it is assumed that an address signal corresponding to address 0 is to be set in the start address register $48_Y$, and address signal corresponding to address 1000 is to be set in the start address register $48_M$, and address signal corresponding to address 2000 is to be set in the address register $48_C$ and address signal corresponding to address 3000 is in the address register $48_K$, then the same as the number of N rotations per cycle pulse that is generated at the output of the rotary encoder 20 at every one rotation of the recording cylinder 12, is at least the number of pulse corresponding to the last address of the start address register $48_K$.

As described the above, it is assumed that each of addresses corresponding to 0, 1000, 2000, and 3000 is set to and stored at each of the start address registers $48_Y$, $48_M$, $48_C$ and $48_K$, respectively by the control data from the CPU 8.

At first, after the contents of the counter 45 having been cleared away by one rotation per cycle pulse, when the counter 45 counts N rotation per cycle pulse corresponding to the address 0 on the recording film, a coincidence signal is output from the comparison circuit $49_Y$ to set the F/F circuit $50_Y$. The channel selector switch 30 in FIG. 5 then is switched to enable the data editing apparatus $29_Y$ and the coincidence signal clears away the contents of the address counter 46 through the OR gates 51 and 52.

Accordingly, the Y address counter 46 begins to count the N rotation per cycle pulse from this time, and the N rotation per cycle pulse is input to each of the comparison circuits $34_{C1} \ldots 34_{Cm}, 34_1 \ldots 34_{Tn}$ and $34_B$, $34_p$ shown in FIG. 5 as address signals in the main scanning direction. According to these input address signals, those predetermined processings, cropping processing, bordering processing etc. are carried out.

When the counter 45 counts the N rotation per cycle pulse corresponding to the address 1000 on the recording film, a coincidence signal is output from the comparison circuit $49_M$. By the coincidence signal the F/F circuit $50_Y$ is reset through the OR gate $53_Y$, simultaneously the F/F circuit $50_M$ is set, and the channel selector 30 in FIG. 5 is switched to enable the data editing circuit $29_M$ and the coincidence signal to clear away the contents of the Y address counter 46 through the OR gates 51 and 52.

The timing control circuit 33 operates, in the cases of those addresses 2000 and 3000, respectively, stored in and set up by the start address registers $48_C$ and $48_K$, similar to the manner of operation regarding address 1000 previously described showing the operation of start address register 48$_Y$; and, timing of operations are as shown in FIG. 9.

In FIG. 8 there is not shown any reset means of the X address counter 47, but the reset signal is output when the recording head 14 (FIG. 1) returns to the position of the origin. In those cases where merely the Y and the M color plates are to be recorded among those Y, M, C and K color plates, it is sufficient to set up values larger than the maximum of the counter 45 can count, as the start addresses in the start address registers 48$_C$ and 48$_K$.

Nextly, with respect to a method for setting up various data which is carried out for operating the above described color scanner, description will be given with reference to FIGS. 1 and 10.

Address data regarding the start and the stop points in each of the X and the Y directions with respect to a plurality of original pictures attached on the original cylinder 2 are written in disc memories (not shown) together with number of each of the original pictures and color separation conditions such as high light density shadow density etc. from an input means provided on a scanning panel (not shown) through the CPU 8.

On the other hand, trimming points, borders and a plurality of flat tone maskings necessary for recording time and the start addresses and the stop addresses etc. in the X and the Y directions regarding cutting mask processing are input to the afore-mentioned disc memories from a coordinate input means 18 which may be a digitizer or a key board switching means in relation to coordinates on the recording cylinder 12 through the CPU 8.

Figure 10A:
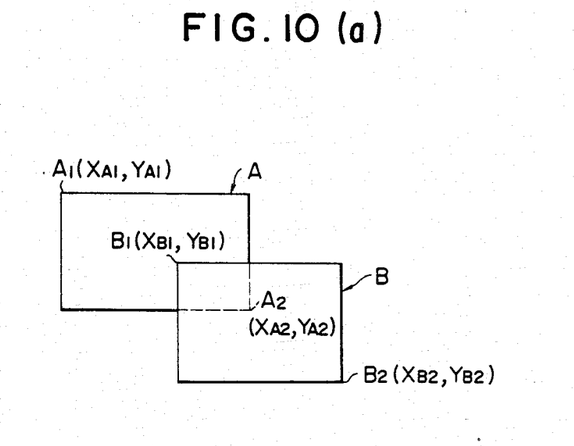
FIG. 10(a) and 10(b) are examples of the final composite picture images after reproduction.
Figure 10B:
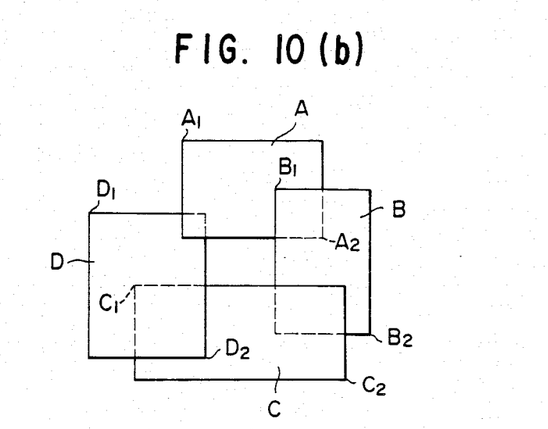

With reference to FIGS. 4 and 10 an example of an address input by the coordinate input means 18 (digitizer) to the disc memory will be explained.

A start point P$_1$ of a cropping area of the picture pattern is input as (X$_{P1}$, Y$_{P1}$), a stop point P$_2$ of the cropping area of the picture pattern is input as (X$_{P2}$, Y$_{P2}$). A start point B$_1$ of an area to be subjected to bordering is input as (X$_{B1}$, Y$_{B1}$), and a stop point B$_2$ of the area to be subjected to bordering processing is input as (X$_{B1}$, Y$_{B2}$). A start point T$_1$ of the flat tone masking 27 is input as (X$_{T1}$, Y$_{T1}$), while a stop point thereof is input as (X$_{T2}$, Y$_{T2}$). A start point T$_1$ of the flat tone masking 27' is input as (X$_{T1}$, Y$_{T1}$), and a stop point T$_2$, thereof is input as (X$_{T2}$, Y$_{T2}$). With respect to the cutting masks 28 and 28', each of start points C$_1$ and C$_1$', is input to the disc memories as (X$_{C1}$, Y$_{C1}$) and (X$_{C1'}$, Y$_{C1'}$), respectively, and each of stop points C$_2$ and C$_2$, is input as (X$_{C2}$, Y$_{C2}$) and (X$_{C2'}$, Y$_{C2'}$), respectively.

With regard to the bordering and flat tone masking, data of halftone dot area ratio of each of the color plates are input together with coordinates data of each of the points.

For setting up the data magnification, data for every original must be input. With respect to setting up the reproduction magnification, for example, it is also possible to set up the reproduction magnification in the magnification converting circuit 7 by calculating the conditions therefor based on the above described start point P$_1$ and the stop point P$_2$, on the original picture on the original picture cylinder 2, and establishing coordinate values of the start point and the stop point for reproduction.

Prior to recording, reproduced picture images are edited by operating a color scanner, according to data input as the above-mentioned. A display device 17, such as a CRT terminal, can display the edited reproduced picture images as figures, so that editing states of the reproduced picture images to be recorded can be previously confirmed, and editing errors can be also reduced.

The way for displaying the edited reproduced picture images on this display device 17 is abbreviated in this specification for the reason that the method is well-known and has been already applied to the picture processing field.

Further, each of address data input by the coordinate input means such as digitizer 18 etc. can be set, for example, to actual length in the mm (millimeter) unit which is measured by setting up a predetermined position on the recording film (which is affixed to the recording cylinder 12) to be the origin.

Accordingly, addresses in the X direction must be related to the number of revolution of the recording cylinder 12, i.e., the output(s) of the X address counter 47 of the timing control circuit 33 (refer to FIGS. 5 and 8), and addresses in the Y direction must by equivalent data to the output of the output of the Y address counter 46.

Now assuming that subscanning feeding pitch of the recording head 14 is P and radius of the recording cylinder 12 is R, the input coordinate data (x, y) are converted into address data (X, Y) according to the following formula.

That is:

$$X = \frac{x}{P}, Y = \frac{yN}{2\pi R}.$$

Here, N is the number of pulses of the N rotation per cycle pulse of the rotary encoder which is output during one rotation of the recording cylinder 12.

Nextly, referring to FIG. 10(a), a case of recording a composite picture image by overlapping picture patterns A and B.

Firstly, in the case of recording an original picture having the picture pattern A by scanning, as data for performing cropping (trimming) process onto the original picture of the picture pattern A, a start point A$_1$ (X$_{A1}$, Y$_{A1}$) and a stop point A$_2$, (X$_{A2}$, Y$_{A2}$) are set up in the address register 32$_p$, of the editing circuit 1 by the CPU 8. As data for cutting mask processing with respect to an area of the recording film on which the picture pattern B is overlapped, a start point B$_1$ (X$_{B1}$, YB$_1$) and a start point B$_2$ (XB$_2$, YB$_2$) are set up in the address register 34$_{C1}$ of the editing circuit 1.

In the case of recording an original picture having the picture pattern B by scanning, as data for cropping data of the original picture of the picture pattern B, the start point B$_1$ (X$_{B1}$, YB$_1$) and a stop point B$_2$ (XB$_2$, YB$_2$) are set up. On portions of the recording film that is to be masked by the afore-mentioned cutting mask processing, the picture pattern B is recorded, so that a composite picture image is recorded on the recording from which shows the picture patterns A and B having an overlap B.

As shown in FIG. 10(b), more complicated overlapping can be edited as well as the case of overlapping two picture patterns and recorded.

That is, regarding the picture pattern A, as trimming data the start point A$_1$ and the stop point A$_2$ are set up, and as cutting mask data the start point B$_1$ and the stop point B$_2$ are also set up. With respect to the picture pattern B as trimming data the start point B$_1$ and the stop point B$_2$ are set up, and further the start point C$_1$ and the stop point C$_2$ are set up as cutting mask data.

Regarding C as trimming data the start point $C_1$ and the stop point $C_2$ are set up, and as cutting mask data the start point $D_1$ and the stop point $D_2$ are set up, with regard to the picture pattern D as trimming data the start point $D_1$ and the stop point $D_2$, and further as cutting mask data the start point $A_1$ and the stop point $A_2$ are set up, respectively.

Thus, if each of the original pictures having picture patterns A, B, C and D is sequentially scanned and recorded, respectively, a composite reproduced picture image such as shown in FIG. 10(b) can be obtained.

In the editing apparatus of the reproduced picture patterns according to the present invention, as described above, a flat tone not including any picture pattern can be also achieve on any desired portion on the recording film.

To record the flat tone masking of the predetermined halftone dot area ratio, the CPU 8 controls stages later than the editing circuit 1 to operate, and based on the start point set up in a predetermined register of the editing circuit 1, and coordinate value of the stop point and halftone dot area ratio of each of color plates Y, M, C and K, the predetermined flat tone mask is recorded on the predetermined position(s) on the recording film. In this case, forbidding codes, such as imaginary addresses in each of the corresponding address registers are set up to perform flat tone masking.

Halftone dot area ratio such as recorded in the flat tone mask processing as mentioned above is apparently and continuously varied. It is also possible to provide a gradation pattern.

A flat tone mask processing area may be divided into a plurality of small areas in the desired gradation direction, and each of the start points and the stop points of the plurality of divided small areas may be set up and with each of predetermined ratios of respective halftone dot area ratios of each of these small areas may be set up to increase or reduce.

In addition, for example, as described in the Japanese Patent Publication (Kokoku) No. 52-18601, when two or more than two color plates are recorded in the main scanning direction on a recording film, conventionally a film to be recorded was recorded on each of areas previously divided based on the number of color plates, so that according to sizes of the color plates to be recorded, some cases produced wasteful areas on the film on which nothing was recorded; however, according to the editing apparatus in the present invention, as described the above, the CPU 8 provides each of the start addresses set up in the respective address registers $32_p$, $32_B$, $32_{T1}$ ... $32T_n$, $32C_1$ ... $32_{CMm}$ of the editing circuit 1, and these registers store data which can control reproduction of color plates according to sizes of color plates which are actually recorded on the recording film. Accordingly, a distance between each of the color plates can be determined to the maximum necessary therefor. As the results, further, other reproduced picture images can be recorded on areas of the recording film which have not been exposed, so that there is further advantage that recording film can be used efficiently.

As described heretofore, according to the present invention a relatively compact constructed editing apparatus with a predetermined priority order of the cropping processing, bordering, flat tone masking, and cutting mask processing to each of the original pictures is disclosed. Even complicated editing processes which are necessary for performing editing picture patterns, (and different from the layout scanner system currently used) may be accomplished without requiring any system of large scale. It is possible to practically achieve picture image processing by a color scanner easily and simultaneously perform layout operation efficiently. Thus, the present invention can provide many practical advantages.

What is claimed is:

1. A simplified editing apparatus for forming composite images, comprising:
    means for scanning a plurality of original picture images separately mounted on a scanning drum, wherein the original picture images are to be used in forming a composite image;
    means for recording a composite image on a record sheet mounted on a recording drum;
    means for digitally storing coordinate data representing locations at which the original picture images are to be recorded in the composite image;
    means for digitally storing editing data representing editing processes which are to be performed while recording the composite image, wherein the editing processes include bordering, cropping, flat tone masking, and cutting masking; and
    editing means for controlling the scanning means and the recording means so as to scan the original picture images, record the scanned original picture images on the record sheet in accordance with the stored coordinate data, and perform editing processes in accordance with the stored editing data, thereby forming the composite image;
    wherein the editing means performs the editing processes of bordering, cropping, flat tone masking, and cutting masking according to a predetermined order of priority.

2. A simplified editing apparatus for forming composite images as defined in claim 1 wherein the scanning means generates a plurality of picture signals while scanning the original picture images and wherein the editing means forms a plurality of color plate signals from the plurality of picture signals.

3. A simplified editing apparatus for forming composite images as defined in claim 1 wherein the editing process of bordering comprises forming borders around selected ones of the original picture images as they are recorded in the composite image.

4. A simplified editing apparatus for forming composite images as defined in claim 1 wherein the editing process of cropping comprises recording only selected portions of the original picture images in the composite image.

5. A simplified editing apparatus for forming composite images as defined in claim 1 wherein the editing process of flat tone masking comprises recording areas having selected flat or constant tones in selected areas of the composite image.

6. A simplified editing apparatus for forming composite images as defined in claim 1 further comprising:
    means for enlarging or reducing each of the original picture images as they are recorded in the composite image.

7. A simplified editing apparatus for forming composite images as defined in claim 14 wherein the editing process of bordering comprises forming borders around selected ones of the original picture images as they are recorded in the composite image.

8. A simplified editing apparatus for forming composite images as defined in claim 14 wherein the editing process of cropping comprises recording only selected portions of the original picture images in the composite image.

9. A simplified editing apparatus for forming composite images as defined in claim 14 wherein the editing process of flat tone masking comprises recording areas having selected flat (i.e. constant) tones in selected areas of the composite image.

10. A simplified editing apparatus for forming composite images as defined in claim 6 wherein the scanning means generates a plurality of picture signals while scanning the original picture images and wherein the editing means forms a plurality of color plate signals from the plurality of picture signals.

11. A simplified editing apparatus for forming composite images, comprising:
 data storage means for storing positional information which indicates areas of composite images which are to be recorded on a recording film in which selected ones of a plurality of editing processes are to be performed, wherein the editing processes include bordering, cropping, flat tone masking, and cutting masking, and are to be performed for each of a plurality of color plate signals derived by sequentially photoelectrically scanning a plurality of original color picture images;
 means for storing halftone dot area ratio data necessary for performing the plurality of editing processes; and
 means for sequentially processing the color plate signals in accordance with the positional information and the halftone dot area ratio data in order to perform the editing processes and record a plurality of composite images corresponding to the plurality of color plate signals on the recording film;
 wherein the editing processes are performed according to a predetermined order of priority.

12. A simplified editing apparatus for forming composite images as defined in claim 15 wherein the means for storing halftone dot area ratio data stores data corresponding to each of the color plate signals.

13. A simplified editing apparatus for forming composite images as defined in claim 15 wherein the predetermined order of priority is such that cutting masking has a higher priority than flat tone masking, which has a higher priority than cropping, which has a high priority than bordering, which therefore has the lowest priority of the four editing processes.

14. A simplified editing apparatus for forming composite images, comprising:
 means for scanning at least one original picture image to produce image data;
 means for storing positional information representing selected areas of said at least one original picture image which are to be recorded in a composite image on a recording medium;
 editing means for processing the image data in accordance with the positional information, said editing means performing a plurality of editing processes in the following predetermined order of priority:
 first, cutting masking;
 secondly, flat tone masking;
 thirdly, cropping; and
 fourthly, bordering; and
 means for recording the selected areas of said at least one original picture on a recording medium to form a composite image in accordance with the image data processed by the editing means.

15. A simplified editing apparatus for forming composite images, comprising:
 a scanning cylinder on which at least one original picture image is mounted;
 a first main-scanning motor for rotating the scanning cylinder;
 a first rotary encoder associated with the first main-scanning motor;
 a scanning head for scanning said at least one original picture image mounted on the scanning cylinder and for generating red, green, and blue primary color signals representative thereof;
 a first sub-scanning motor for driving the scanning head;
 a second rotary encoder associated with the first sub-scanning motor;
 a first motor control means for controlling the first main-scanning motor and the first sub-scanning motor in response to outputs of the first and second rotary encoders and a first control input;
 a recording cylinder on which a recording medium is mounted, wherein a composite image is to be recorded on the recording medium;
 a second main-scanning motor for rotating the recording cylinder;
 a third rotary encoder associated with the second main-scanning motor;
 a recording head for scanning the recording medium mounted on the recording cylinder and for recording a composite image thereon in response to recording signals;
 a second sub-scanning motor for driving the recording head;
 a fourth rotary encoder associated with the second sub-scanning motor;
 a second motor control means for controlling the second main-scanning motor and the second sub-scanning motor in response to outputs of the third and fourth rotary encoders and a second control input;
 color calculation means for converting the red, green, and blue primary color signals generated by the scanning head to yellow, magenta, cyan, and black color plate signals;
 magnification converting means for selectively enlarging or reducing said at least one original picture image by processing the color plate signals in response to the outputs of the first and third rotary encoders and magnification data provided from a third control input;
 editing means for performing a plurality of editing processes on the color plate signals processed by the magnification converting means, wherein the editing processes are performed to produce a composite image and comprise the editing processes of bordering, cropping, flat tone masking, and cutting masking, and wherein the editing means performs the editing processes according to a predetermined order of priority in response to the output of the third rotary encoder and positional information and halftone dot area ratio data provided from a fourth control input;
 dot forming means for converting the color plate signals processed by the editing means to recording signals and for supplying the recording signals to the recording head; and
 a central processing unit, having a display, a keyboard, and a coordinate input means, for providing the first, second, third, and fourth control inputs to the first motor control means, the second motor control means, the magnification converting means, and the editing means, respectively, in response to the outputs of the first, second, third, and fourth rotary encoders and magnification data, positional information, and halftone dot area ratio data input by an operator.

* * * * *